US011199506B2

(12) United States Patent
Shaubi et al.

(10) Patent No.: US 11,199,506 B2
(45) Date of Patent: Dec. 14, 2021

(54) GENERATING A TRAINING SET USABLE FOR EXAMINATION OF A SEMICONDUCTOR SPECIMEN

(71) Applicant: Applied Materials Israel Ltd., Rehovot (IL)

(72) Inventors: Ohad Shaubi, Yavne (IL); Assaf Asbag, Alfei Menashe (IL); Boaz Cohen, Lehavim (IL)

(73) Assignee: Applied Materials Israel Ltd., Rehovot (IL)

( * ) Notice: Subject to any disclaimer, the term of this patent is extended or adjusted under 35 U.S.C. 154(b) by 231 days.

(21) Appl. No.: 16/280,869

(22) Filed: Feb. 20, 2019

(65) Prior Publication Data

US 2019/0257767 A1 Aug. 22, 2019

Related U.S. Application Data

(60) Provisional application No. 62/633,555, filed on Feb. 21, 2018.

(51) Int. Cl.
 G01N 21/95 (2006.01)
 G06N 3/08 (2006.01)
 (Continued)

(52) U.S. Cl.
 CPC ....... G01N 21/9501 (2013.01); G01N 21/956 (2013.01); G06F 30/20 (2020.01);
 (Continued)

(58) Field of Classification Search
 CPC ........... G01N 21/9501; G01N 21/8887; G01N 21/956; G01N 2021/8883; G01N 21/8851;
 (Continued)

(56) References Cited

U.S. PATENT DOCUMENTS 9,965,901 B2 * 5/2018 Zhang ................. G06K 9/6257
10,043,261 B2 * 8/2018 Bhaskar ................... G03F 1/84
(Continued)

OTHER PUBLICATIONS

"A Deep Convolutional Neural Network for Wafer Defect Identification on an Imbalanced Dataset in Semiconductor Manufacturing Processes"; Muhammad Saqlain, IEEE Transactions on Semiconductor Manufacturing (vol. 33, Issue: 3, pp. 436-444) (Year: 2020).*
(Continued)

*Primary Examiner* — Michael S Osinski
(74) *Attorney, Agent, or Firm* — Lowenstein Sandler LLP

(57) ABSTRACT

There is provided a system and method of generating a training set usable for examination of a semiconductor specimen. The method comprises: obtaining a simulation model capable of simulating effect of a physical process on fabrication process (FP) images depending on the values of parameters of the physical process; applying the simulation model to an image to be augmented for the training set and thereby generating one or more augmented images corresponding to one or more different values of the parameters of the physical process; and including the generated one or more augmented images into the training set. The training set can be usable for examination of the specimen using a trained Deep Neural Network, automated defect review, automated defect classification, automated navigation during the examination, automated segmentation of FP images, automated metrology based on FP images and other examination processes that include machine learning.

16 Claims, 4 Drawing Sheets

(51) Int. Cl.
*G06T 7/00* (2017.01)
*G01N 21/956* (2006.01)
*G06T 7/174* (2017.01)
*G06F 30/20* (2020.01)

(52) U.S. Cl.
CPC ............. *G06N 3/08* (2013.01); *G06T 7/0004* (2013.01); *G06T 7/174* (2017.01); *G06T 2207/10061* (2013.01); *G06T 2207/20081* (2013.01); *G06T 2207/20084* (2013.01); *G06T 2207/30148* (2013.01)

(58) Field of Classification Search
CPC . G01N 2021/8887; G06F 30/20; G06F 30/27; G06N 3/08; H01L 22/12; H01L 22/20; G06T 2207/10004; G06T 7/0004; G06T 7/174; G06T 2207/20084; G06T 2207/30148; G06T 2207/10061; G06T 2207/20081; G06T 7/0008; G06T 7/33; G06T 7/11

See application file for complete search history.

(56) References Cited

U.S. PATENT DOCUMENTS

| | | | | |
|---|---|---|---|---|
| 10,648,924 | B2* | 5/2020 | Zhang | G01N 21/9501 |
| 10,832,092 | B2* | 11/2020 | Shaubi | G06K 9/6223 |
| 2008/0279444 | A1* | 11/2008 | Fischer | G01N 21/9501 382/145 |
| 2008/0304029 | A1* | 12/2008 | Pforr | G03F 1/36 355/44 |
| 2009/0024967 | A1* | 1/2009 | Su | G03F 1/68 716/136 |
| 2009/0266985 | A1* | 10/2009 | Nakahira | H01J 37/28 250/307 |
| 2009/0283677 | A1* | 11/2009 | Ikku | G01N 23/2208 250/307 |
| 2011/0110578 | A1* | 5/2011 | Longo | H04N 5/232123 382/144 |
| 2012/0156810 | A1* | 6/2012 | Fukazawa | G01N 21/95607 438/16 |
| 2013/0135496 | A1* | 5/2013 | Nomura | G06K 9/6217 348/231.6 |
| 2013/0260396 | A1* | 10/2013 | Akcakir | G01N 33/54313 435/7.25 |
| 2014/0369581 | A1* | 12/2014 | Fu | G06T 11/006 382/131 |
| 2015/0346610 | A1* | 12/2015 | Tam | G03F 7/70666 355/55 |
| 2016/0098836 | A1* | 4/2016 | Yamato | A61B 6/50 382/128 |
| 2016/0313658 | A1 | 10/2016 | Marciano et al. | |
| 2017/0177997 | A1 | 6/2017 | Karlinsky et al. | |
| 2017/0328842 | A1* | 11/2017 | Otani | G01N 21/95623 |
| 2018/0082415 | A1* | 3/2018 | Sezginer | G03F 1/84 |
| 2018/0107928 | A1* | 4/2018 | Zhang | G06K 9/4628 |
| 2018/0240225 | A1* | 8/2018 | Harada | G06T 7/001 |
| 2018/0293456 | A1* | 10/2018 | Bredno | G06K 9/34 |
| 2018/0336677 | A1* | 11/2018 | Sloan | G06T 7/30 |
| 2018/0373999 | A1* | 12/2018 | Xu | G06K 9/00765 |
| 2019/0005386 | A1* | 1/2019 | Chen | G06K 9/6274 |
| 2019/0028687 | A1* | 1/2019 | Tsai | G06T 7/0014 |
| 2019/0079533 | A1* | 3/2019 | Zhu | G06N 3/08 |
| 2019/0080470 | A1* | 3/2019 | Zhu | G06K 9/6289 |
| 2019/0108651 | A1* | 4/2019 | Gu | G06K 9/00 |
| 2019/0251434 | A1* | 8/2019 | Wu | G06N 3/082 |
| 2019/0302436 | A1* | 10/2019 | Hsu | A01N 1/02 |

OTHER PUBLICATIONS

Gatys et al., A neural algorithm of artistic style, arXiv preprint arXiv:1508.06576, 2015, 16 pages.

Che et al., Recurrent neural networks for multivariate time series with missing values, Scientific reports, Apr. 17, 2018, vol. 8 No. 6085, 12 pages.

Hinton et al., Unsupervised discovery of nonlinear structure using contrastive backpropagation, Cognitive Science, Jan. 12, 2006, vol. 30, No. 4, 725-731 pages.

Lin et al., RefineNet: Multi-path refinement networks for high-resolution semantic segmentation, In Proceedings of the IEEE conference on computer vision and pattern recognition, 2017, 1925-1934 pages.

Cheng et al., Person re-identificaton by multi-channel parts-based CNN with improved triplet loss function, in Proceedings of the IEEE conference on computer vision and pattern recognition, 2016, 1335-1344 pages.

Taigman et al., Deepface: Closing the gap to human-level performance in face verification. IEEE Computer Vision and Pattern Recognition (CVPR). vol. 5, 2014, 8 pages.

Kooi et al., Large scale deep learning for computer aided detection of mammographic lesions, Medical Image Analysis, vol. 35, 2017, 303-312 pages.

Koch, Gregory., Siamese neural networks for one-shot image recognition, ICML Deep Learning Workshop, vol. 2, 2015, 30 pages.

Su et al., Multi-view convolutional neural networks for 3D shape recognition, Proceedings of the IEEE international conference on computer vision, 2015, 945-953 pages.

Park et al., Combining multiple sources of knowledge in deep CNNs for action recognition, 2016, IEEE Winter Conference on Applications of Computer Vision (WACV), 2016, 8 pages.

Huang et al., Densely connected convolutional networks, Proceedings of the IEEE conference on computer vision and pattern recognition, 2017, 4700-4708 pages.

Simonyan et al., Very deep convolutional networks for large-scale image recognition, arXiv preprint arXiv:1409.1556, ICLR, 2015, 14 pages.

"DL Commonality Forum (Super SEM Layer + Demo)" Applied Materials, Aug. 2017, 13 pages.

"Inception Modules", video captured on Jun. 6, 2016, retrieved from the Internet Nov. 11, 2019: https://www.youtube.com/watch?v=VxhSouuSZDY. 0:00 minutes, 0:01 minutes, 0:11 minutes, and 0:32 minutes.

Krizhevsky et al., Imagenet classification with deep convolutional neural networks. NIPS'12: Proceedings of the 25th International Conference on Neural Information Processing Systems—vol. 1, Dec. 2012, pp. 1097-1105 (9 pages total).

* cited by examiner

GENERATING A TRAINING SET USABLE FOR EXAMINATION OF A SEMICONDUCTOR SPECIMEN

TECHNICAL FIELD

The presently disclosed subject matter relates, in general, to the field of examination of a specimen, and more specifically, to automating the examination of a specimen.

BACKGROUND

Current demands for high density and performance associated with ultra large scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

By way of non-limiting example, run-time examination can employ a two phase procedure, e.g. inspection of a specimen followed by review of sampled locations of potential defects. During the first phase, the surface of a specimen is inspected at high-speed and relatively low-resolution. In the first phase, a defect map is produced to show suspected locations on the specimen having high probability of a defect. During the second phase at least part of the suspected locations are more thoroughly analyzed with relatively high resolution. In some cases both phases can be implemented by the same inspection tool, and, in some other cases, these two phases are implemented by different inspection tools.

Examination processes are used at various steps during semiconductor fabrication to detect and classify defects on specimens. Effectiveness of examination can be increased by automatization of process(es) as, for example, Automatic Defect Classification (ADC), Automatic Defect Review (ADR), etc.

GENERAL DESCRIPTION

In accordance with certain aspects of the presently disclosed subject matter, there is provided a method of generating a training set usable for examination of a semiconductor specimen. The method comprises: obtaining a simulation model capable of simulating effect of a physical process on fabrication process (FP) images (e.g. SEM images but not necessary so), wherein simulation is dependable on values of parameters of the physical process; applying the simulation model to an image to be augmented for the training set and thereby generating one or more augmented images corresponding to one or more different values of the parameters of the physical process; and including the generated one or more augmented images into the training set.

The training set can be usable for examination of the specimen using a trained Deep Neural Network, automated defect review, automated defect classification, automated navigation during the examination, automated segmentation of FP images, automated metrology based on FP images and other examination processes that include machine learning.

The image to be augmented can be a "real world" image, synthetic image, previously augmented images or other images usable in the training set.

In accordance with further aspects of the presently disclosed subject matter, the simulation model can be a parametric model or an estimated model of a respective physical effect. By way of non-limiting examples, the effect of a physical process can be noise, Grey Level (GL) calibration between tools, focusing errors, color variation, charging, vibration, quad detectors mis-calibration, etc.

In accordance with further aspects of the presently disclosed subject matter, the generated one or more augmented images can be included into the training set in association with a ground truth data.

In accordance with further aspects of the presently disclosed subject matter, the one or more augmented images can be generated by applying the simulation model together with other data (e.g. CAD data, reference data, etc.).

In accordance with other aspects of the presently disclosed subject matter, there is provided a system usable for examination of a semiconductor specimen and configured to operate in accordance with the method above.

In accordance with other aspects of the presently disclosed subject matter, there is provided a non-transitory computer readable medium comprising instructions that, when executed by a computer, cause the computer to perform the method above.

Among advantages of certain embodiments of the presently disclosed subject matter is enhanced robustness of respective examination process trained with the training set generated as disclosed herein.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "representing", "comparing", "generating", "training", "segmenting", "registering" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the FPEI (Fabrication Process Examination Information) system and respective parts thereof disclosed in the present application.

The terms "non-transitory memory" and "non-transitory storage medium" used herein should be expansively construed to cover any volatile or non-volatile computer memory suitable to the presently disclosed subject matter.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats as, by way of non-limiting examples, GDSII format, OASIS format, etc. Design data can be presented in vector format, grayscale intensity image format or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Figure 1:
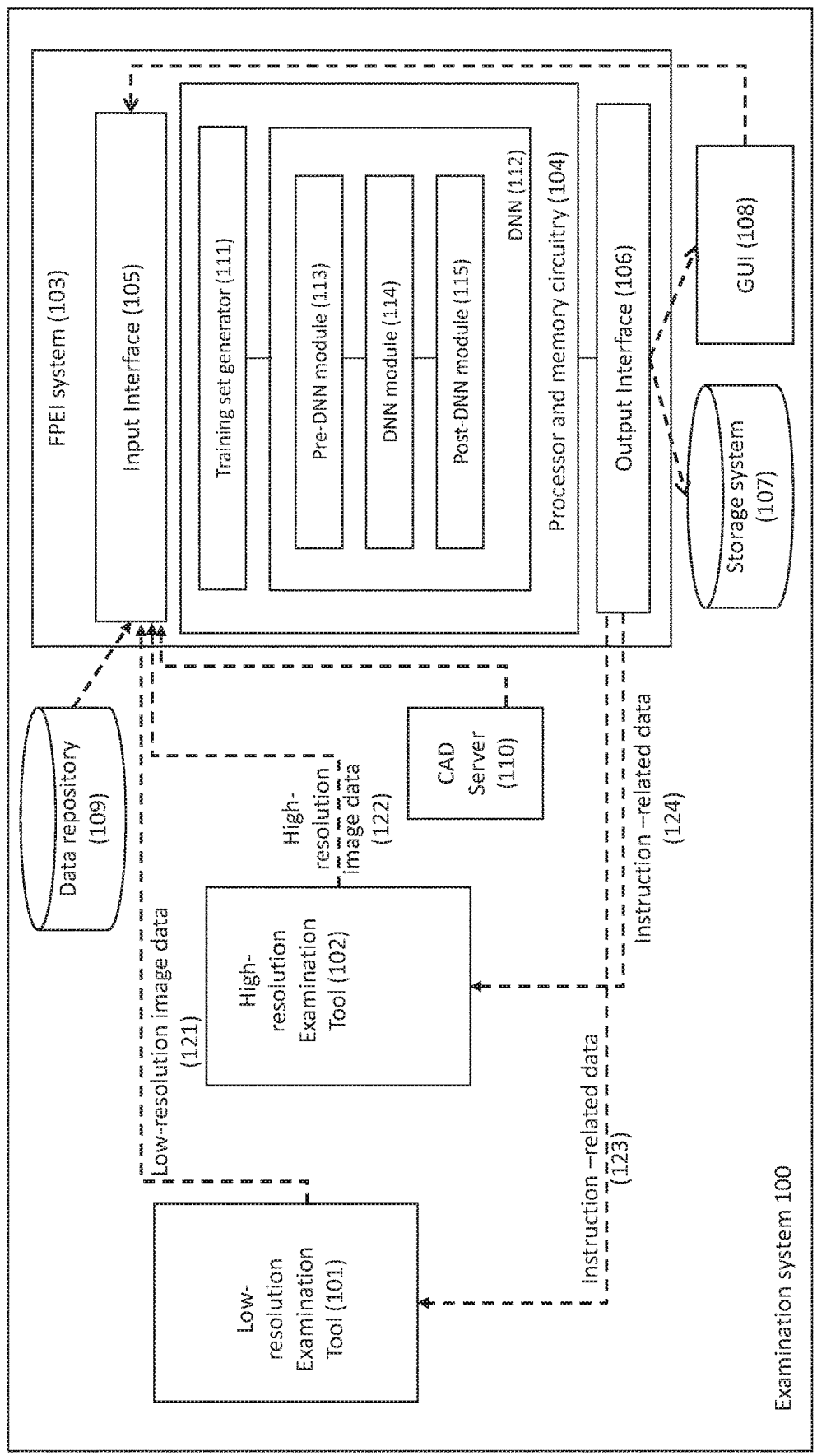
FIG. 1 illustrates a generalized block diagram of an examination system in accordance with certain embodiments of the presently disclosed subject matter.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as a part of the specimen fabrication process. The illustrated examination system 100 comprises computer-based system 103 capable of automatically determining metrology-related and/or defect-related information using images obtained during specimen fabrication (referred to hereinafter as fabrication process (FP) images). The system 103 is referred to hereinafter as an FPEI (Fabrication Process Examination Information) system. FPEI system 103 can be operatively connected to one or more low-resolution examination tools 101 and/or one or more high-resolution examination tools 102 and/or other examination tools. The examination tools are configured to capture FP images and/or to review the captured FP image(s) and/or to enable or provide measurements related to the captured image(s). The FPEI system can be further operatively connected to CAD server 110 and data repository 109.

FPEI system 103 comprises a processor and memory circuitry (PMC) 104 operatively connected to a hardware-based input interface 105 and to a hardware-based output interface 106. PMC 104 is configured to provide all processing necessary for operating the FPEI system as further detailed with reference to FIGS. 2-4 and comprises a processor (not shown separately) and a memory (not shown separately). The processor of PMC 104 can be configured to execute several functional modules in accordance with computer-readable instructions implemented on a non-transitory computer-readable memory comprised in the PMC. Such functional modules are referred to hereinafter as comprised in the PMC. Functional modules comprised in PMC 104 include operatively connected training set generator 111. Functional modules can further comprise Deep Neural Network (DNN) 112. DNN 112 comprises a DNN module 114 configured to enable data processing using deep neural network(s) for outputting application-related data based on the fabrication (FP) input data. Optionally, DNN 112 can comprise pre-DNN module 113 configured to provide pre-processing before forwarding input data to the DNN module and/or post-DNN module 115 configured to provide post-processing data generated by DNN module. Operation of FPEI system 103, PMC 104 and the functional blocks therein will be further detailed with reference to FIGS. 2-4.

DNN module 114 can comprise a supervised or unsupervised DNN 112 comprising layers organized in accordance with respective DNN architecture. By way of non-limiting example, the layers of DNN can be organized in accordance with Convolutional Neural Network (CNN) architecture, Recurrent Neural Network architecture, Recursive Neural Networks architecture, Generative Adversarial Network (GAN) architecture or otherwise. Optionally, at least part of the layers can be organized in a plurality of DNN sub-networks. Each layer of DNN module 114 can include multiple basic computational elements (CE) typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. The activation function can be, for example, an identity function, a deterministic function (e.g., linear, sigmoid, threshold, or the like), a stochastic function or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of a deep neural network can be initially selected prior to training, and can be further iteratively adjusted or modified during training to achieve an optimal set of weighting and/or threshold values in a trained DNN. After each iteration, a difference can be determined between the actual output produced by DNN module and the target output associated with the respective training set of data. The difference can be referred to as an error value. Training can be determined to be complete when a cost function indicative of the error value is less than a predetermined value or when a limited change in performance between iterations is achieved. Optionally, at least part of DNN subnetworks (if any) can be trained separately prior to training the entire DNN.

A set of DNN input data used to adjust the weights/thresholds of a deep neural network is referred to hereinafter as a training set.

Inputs to DNN 112 can be pre-processed by pre-DNN module 113 prior to inputting to DNN module 114, and/or outputs of DNN module 114 can be post-processed by post-DNN module 115 before outputting from DNN 112. In such cases training of DNN 112 further includes determining parameters of the pre-DNN module and/or post-DNN module. Optionally, the DNN module can be trained so as to minimize cost function of the entire DNN, while parameters of the pre-DNN module and/or post-DNN module can be predefined and can be adjusted during the training. A set of training-based parameters, characterizing DNN 112 upon training, can further include parameters related to pre-DNN and post-DNN processing.

It is noted that the teachings of the presently disclosed subject matter are not bound by DNN 112 architecture.

Alternatively or additionally to DNN 112, PMC can comprise Automatic Defect Review Module (ADR) and/or Automatic Defect Classification Module (ADC) and/or other examination modules usable, after being trained, for examination of a semiconductor specimen. Optionally, one or more examination modules can comprise DNN 112. Optionally, DNN 112 can be shared between the examination modules or, alternatively, each of said one or more examination modules can comprise its own DNN 112.

As will be further detailed with reference to FIGS. 2-4, FPEI system is configured to receive, via input interface 105, FP input data. FP input data can include data (and/or derivatives thereof and/or metadata associated therewith) produced by the examination tools and/or data stored in one or more data depositories 109 and/or in CAD server 110 and/or another relevant data depository. It is noted that FP input data can include images (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen. Optionally, for training purposes, FP input data can include the entire available FAB data or part thereof selected in accordance with certain criteria.

FPEI system is further configured to process at least part of the received FP input data and send, via output interface 106, the results (or part thereof) to a storage system 107, to examination tool(s), to a computer-based graphical user interface (GUI) 108 for rendering the results and/or to external systems (e.g. Yield Management System (YMS) of a FAB). GUI 108 can be further configured to enable user-specified inputs related to operating FPEI system 103.

By way of non-limiting example, a specimen can be examined by one or more low-resolution examination machines 101 (e.g. an optical inspection system, low-resolution SEM, etc.). The resulting data (referred to hereinafter as low-resolution image data 121) informative of low-resolution images of the specimen can be transmitted—directly or via one or more intermediate systems—to FPEI system 103. Alternatively or additionally, the specimen can be examined by a high-resolution machine 102 (e.g. a subset of potential defect locations selected for review can be reviewed by a scanning electron microscope (SEM) or Atomic Force Microscopy (AFM)). The resulting data (referred to hereinafter as high-resolution image data 122) informative of high-resolution images of the specimen can be transmitted—directly or via one or more intermediate systems—to FPEI system 103.

It is noted that image data can received and processed together with metadata (e.g. pixel size, text description of defect type, parameters of image capturing process, etc.) associated therewith.

Upon processing the FP input data (e.g. low-resolution image data and/or high-resolution image data, optionally together with other data as, for example, design data, synthetic data, etc.) FPEI system can send the results (e.g. instruction-related data 123 and/or 124) to any of the examination tool(s), store the results (e.g. defect attributes, defect classification, etc.) in storage system 107, render the results via GUI 108 and/or send to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

Without limiting the scope of the disclosure in any way, it should also be noted that the examination tools can be implemented as inspection machines of various types, such as optical imaging machines, electron beam inspection machines and so on. In some cases the same examination tool can provide low-resolution image data and high-resolution image data. In some cases at least one examination tool can have metrology capabilities.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in another embodiments at least part of examination tools 101 and/or 102, data repositories 109, storage system 107 and/or GUI 108 can be external to the examination system 100 and operate in data communication with FPEI system 103 via input interface 105 and output interface 106. FPEI system 103 can be implemented as stand-alone computer(s) to be used in conjunction with the examination tools. Alternatively, the respective functions of the FPEI system can, at least partly, be integrated with one or more examination tools.

For purpose of illustration only, the following description is provided for examination of a semiconductor specimen using a trained DNN. Those skilled in the art will readily appreciate that the teachings of the presently disclosed subject matter are, likewise, applicable to generating training sets for other examination modules as, for example, ADR, ADC, an automated navigation module, an automated segmentation module and alike.

Figure 2:
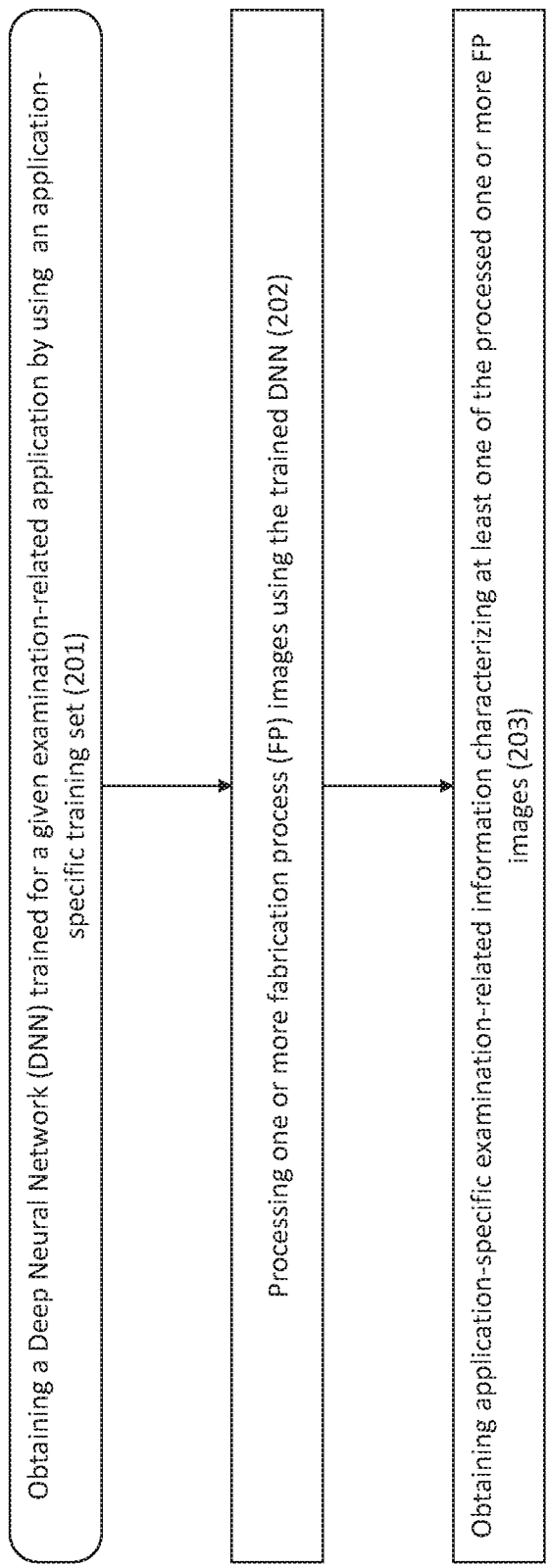
FIG. 2 illustrates a generalized flow-chart of using a deep neural network (DNN) for automatically determining examination-related data based on fabrication process (FP) images in accordance with certain embodiments of the presently disclosed subject matter.

Referring to FIG. 2, there is illustrated a generalized flow-chart of using the DNN 112 for automatically determining examination-related data based on fabrication process (FP) images. As has been presented in US Patent Application No. 2017/0177997 assigned to the Assignee of the present application and incorporated herewith by reference in its entirety, the process can include a setup step comprising training the Deep Neural Network (DNN) 112, wherein DNN is trained for a given examination-related application and, upon training, is characterized by an application-specific set of training-based parameters. By way of non-limiting example, an examination-related application can be one of the following:
- defect classification using attributes generated by DNN (defining classes can include modifying and/or updating preexisting class definitions and/or identifying new classes);
- segmentation of the fabrication process image including partitioning of FP image into segments (e.g. material types, edges, pixel labeling, regions of interest, etc.);
- defect detection (e.g. identifying one or more candidate defects (if they exist) using an FP image and marking thereof, determining truth value for candidate defects, obtaining shape information for the defects, etc.).
- registration between two or more images including obtaining the geometrical warping parameters between the images (can be global or local, simple as shift or more complex transformations);
- cross-modality regression (e.g. reconstructing an image from one or more images from a different examination modality as, for example, an SEM or optical image from CAD, a height map from SEM images, a high resolution image from low resolution images);
- regression-based estimation of image properties;
- combination(s) of the above.

DNN 112 trained for a given application is obtained (201) during the setup step. As will be further detailed with reference to FIGS. 3-5, PMC 104 (e.g. training set generator 111) can be configured to generate an application-specific training set further usable for training of DNN 112. Generating the training set can include augmenting the training samples (and the ground truth data if applicable) and including the augmented training images and augmented ground truth data into the training samples. Alternatively or additionally, generating the training set can include generating synthetic images (and obtaining the ground truth data if necessary) and including the synthetic images into the training samples.

It is noted that the DNN training process can be cyclic, and can be repeated several times until the DNN is sufficiently trained. The process can start from an initially generated training set, while a user provides feedback for the results reached by the DNN based on the initial training set. The provided feedback can include, for example:
- manual re-classification of one or more pixels, regions and/or defects;
- prioritization of classes;
- changes of sensitivity, updates of ground-truth segmentation and/or manually defining regions of interest (ROIs) for segmentation applications;
- re-defining mask/bounding box for defect detection applications;
- re-selecting failed cases and/or manually registering failures for registration applications;
- re-selecting features of interest for regression-based applications, etc.

PMC can adjust the next training cycle based on the received feedback. Adjusting can include at least one of: updating the training set, updating cost function, updating pre-DNN and/or post/DNN algorithms, etc. Optionally, some of the training cycles can be provided not to the entire DNN 112, but rather to pre-DNN module 113, post-DNN module 115 or to one or more higher layers of DNN module 114.

During the runtime, the PMC of FPEI system uses the obtained trained DNN 112 to process (202) a FP sample comprising FP images. Thereby PMC obtains (203) application-specific examination-related data characterizing at least one of the images in the processed FP sample. When processing FP samples, PMC can also use predefined parameters and/or parameters received from other sources in addition to the training-based parameters characterizing DNN 112 upon training.

FP images in the FP sample can arrive from different examination modalities (e.g. from different examination tools; from different channels of the same examination tool as, for example, bright field and dark field images; from the same examination tool using different operational parameters; can be derived from design data, etc.). It is noted that examination modalities can differ one from another by sources of respective images (e.g. images captured by a scanning electron microscope (SEM), by images captured by an optical inspection system, images derived from the captured images, CAD-based generated images, etc.) and/or by deriving techniques applied to the captured images (e.g. images derived by segmentation, defect contour extraction, height map calculation, etc.) and/or by examination parameters (e.g. by perspective and/or resolution provided by a certain examination tool, etc.). By way of non-limiting example, the FP sample can comprise a group of images related to the defect to be classified and obtained by the same or by different examination modalities, reference die image, CAD-based image, data derived from the obtained images (e.g. height map, defect mask, grades, segmentations, etc.). FP sample can further comprise metadata (e.g. imaging conditions, pixel-size, engineered attributes (e.g. defect size, orientation, background segment, etc.), etc.) related to the image and/or defects therein. By way of non-limiting example, metadata can be generated by the PMC in accordance with predefined instructions stored in the PMC and/or received from respective examination tools.

Optionally, training samples can correspond to FP samples. Each training sample can comprise at least the same number of images obtained by the same examination modalities and being in the same relationship as the images in a respective FP sample. It is noted that in certain embodiments training samples can miss some images corresponding to the images in FP sample. Such deficiencies can be compensated by different techniques, some of them known in the art (e.g. a missing image can be compensated by an image generated in accordance with mean values of corresponding images from another training samples, etc.). Optionally, training samples can further comprise additional images obtained by additional examination modalities being, typically, unavailable during runtime and/or obtained by augmentation of images available for training and/or by generation of one or more synthetic images.

For example, FP images can be selected from images of specimen (e.g. wafer or parts thereof) captured during the manufacturing process, derivatives of the captured images obtained by various pre-processing stages (e.g. images of a part of a wafer or a photomask captured by SEM or an optical inspection system, SEM images roughly centered around the defect to be classified by ADC, SEM images of larger regions in which the defect is to be localized by ADR, registered images of different examination modalities corresponding to the same mask location, segmented images, height map images, etc.) and computer-generated design data-based images.

By way of non-limiting example, application-specific examination-related data can represent a per-pixel map of values whose meaning depends on an application (e.g. binary map for defect detection; discrete map for nuisance family prediction indicating the family type or general class; discrete map for defect type classification; continuous values for cross modality or die-to model (D2M) regression, etc.). A per-pixel map can be further obtained together with a per-pixel probability map indicative of probability of values obtained for the pixels.

Alternatively or additionally, application-specific examination-related data can represent one or more values summarizing the entire image content (not per-pixel), such as, for example, defect attributes, defect bounding box candidates and associated defectiveness probabilities for automatic defect review application, defect class and class probability for automatic defect classification application, etc.

Alternatively or additionally, obtained application-specific defect-related data can be not directly related to defects, but be usable for defect analyses (e.g. boundaries between layers of the wafer obtained by segmentation of FP images can be usable for defining defects' layers, defect environment data as, for example, characteristics of the background pattern, etc.). Alternatively or additionally, examination-related data can be usable for metrology purposes.

Figure 3:
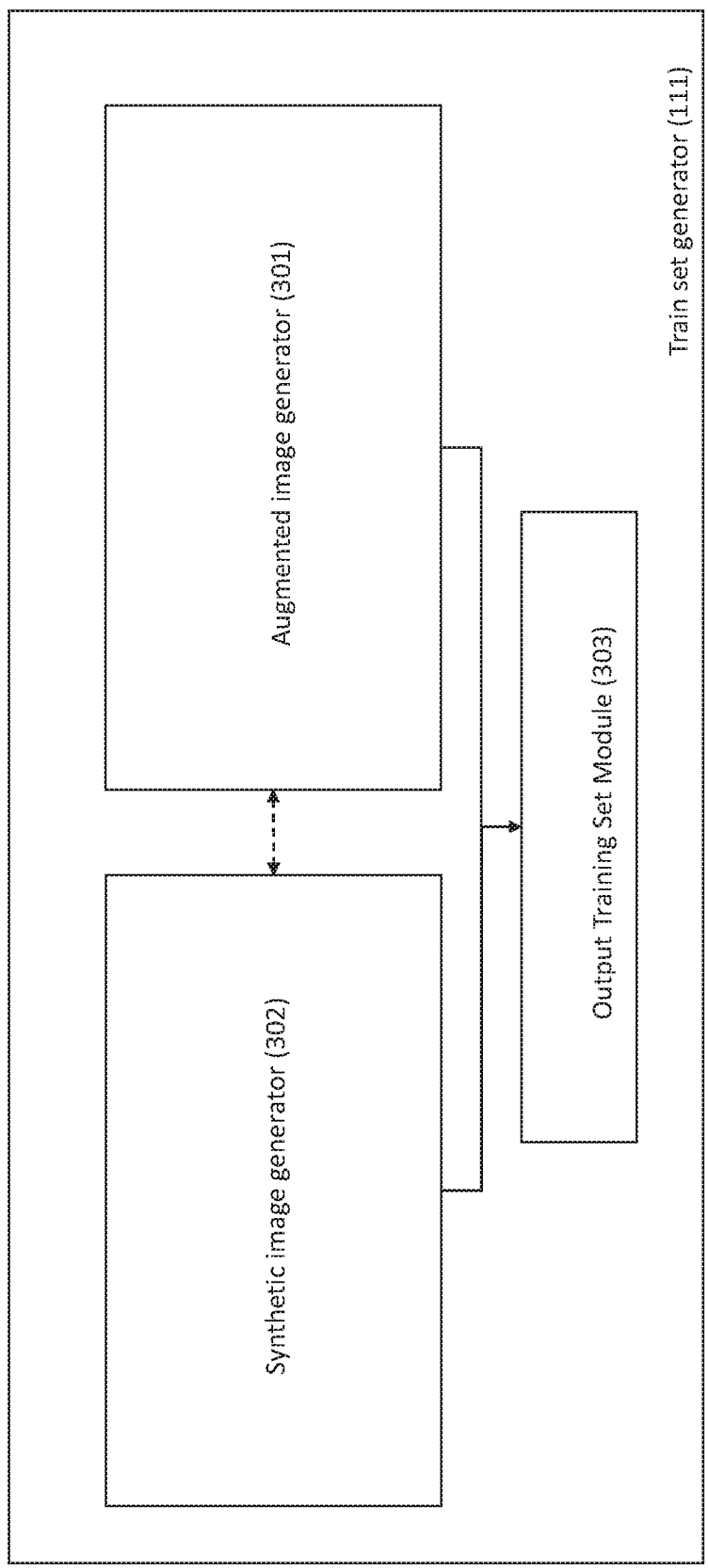
FIG. 3 illustrates a generalized functional block diagram of a training set generator configured in accordance with certain embodiments of the presently disclosed subject matter.

Referring to FIG. 3, there is illustrated training set generator 111. In accordance with certain embodiments of the currently presented subject matter, training set generator 111 comprises a generator of augmented images 301, a generator of synthetic images 302 and an output training set module 303 operatively coupled to generator 301 and generator 302 and configured to generate a training set comprising "real world" training sample, synthetic training sample and/or augmented training sample. The generated training set can be stored in the memory of PMC 104.

Training set generator can obtain data for "real world" training samples (and, optionally, ground truth data) via input interface 105 from data repository 109, CAD server 110 or any other suitable data repository. Alternatively or additionally, ground truth data can be obtained via GUI 108.

Depending on the application, a "real world" training sample can be a single image or a group of images of a specimen obtained by the same or by different examination modalities. A "real world" training sample can further comprise numeric data associated with the images as, for example, metadata, hand-crafted attributes (e.g. defect size, orientation, background segment, etc.) and others. Values of ground truth data can include images and/or labels associated with application-specific training samples. Ground truth data can be synthetically produced (e.g. CAD-based images), actually produced (e.g. captured images), produced by machine-learning annotation (e.g. labels based on feature extracting and analysis), produced by human annotation, or a combination of the above, etc.

It is noted that, depending on the application, the same image can be used in a training sample or for ground truth data. By way of non-limiting example, a CAD-based image can be used as a training sample for segmentation applications and as ground truth data for regression-based applications. As has been presented in US Patent Application No. 2017/0177997, ground truth data can vary by application.

Augmented image generator 301 is configured to augment one or more images from a "real world" training sample, thereby deriving augmented images. Augmentation of an image from a "real world" training sample can be provided by various image processing techniques including adding noise, blurring, geometric transformation (e.g. rotating, stretching, simulating different angles, cropping, scaling, etc.) tone mapping, changing vector information of one or more pixels of the image (e.g. adding and/or modifying perspectives or channels of acquisition, etc.), etc.

Alternatively or additionally, an image from a "real world" training sample can be augmented using synthetic data (e.g. defect-related data, simulated connectors or other objects, implants from other images, etc.). By way of non-limiting example, available images (and/or parameters) of known defect types can be used to plant a new defect in an image, amplify the defectiveness of a pre-existing defect in the image, remove a defect from the image, disguise a defect in the image (making it harder to detect), etc.

For example, generating an image with a synthetic defect can comprise:
training a CNN DNN (e.g. Alex-Net based, etc.);
obtaining $1^{st}$ image containing a selected defect;
obtaining $2^{nd}$ image containing a selected background;
using the trained CNN net to conduct a "style transfer" of the selected defect into the selected background. Such conducting can be provided, for example, using the technique disclosed in https://arxiv.org/pdf/1508.06576.pdf.

Yet alternatively or additionally, a captured image from a "real world" training sample can be augmented using segmentation, defect contour extraction and/or height map calculation, and/or can be obtained by processing together with corresponding CAD-based image.

Augmentation techniques can be applied to the image(s) of the "real world" training sample in an application-independent manner. Alternatively, augmented training samples can be derived in an application-specific manner, wherein at least a substantial part of respective augmented images is obtained by technique(s) preferable to a specific application. Table 1 illustrates non-limiting examples of application-specific preferable augmentation techniques.

TABLE 1

Application-specific examples of preferable augmentation techniques

| Application | Non-limiting example of preferable augmentation techniques |
|---|---|
| Classification | Geometric transformation, tone mapping, implanting synthetic defects, modification of defect tones |
| Regression | Adding noise, blurring, tone mapping |
| Segmentation | Adding noise, blurring, tone mapping, synthetic images |
| Defect detection | Adding noise, blurring, tone mapping, implanting synthetic defects, modification of defect tones |
| Registration | Geometric transformation, tone mapping |

Optionally, augmentation techniques can be also applied to synthetic images generated by synthetic image generator 302 and the training set generated by output module 303 can further include synthetic images generated by generator 302 and further augmented by generator 301.

Thus, in accordance with certain embodiments of the presently disclosed subject matter, the number of training samples in the generated training set can be substantially larger than a number of "real world" training samples. For example, the set of "real world" training samples can include between 100 and 50,000 training samples, while the training set generated in accordance with certain embodiments of the presently disclosed subject matter can include at least 100,000 training samples. It is noted that capturing images is a slow—and possibly also costly—process. Generating a sufficient amount of training samples in the training set by augmenting the captured images and/or generating synthetic images enables efficiency of DNN training.

Furthermore, techniques of augmentation and synthetic image generation enable tailoring the generated training set to the requirements of specific application. By way of non-limiting example, lack of FAB data related to specific class of defects (e.g. minority class) can be compensated by synthetic and/or augmented images presenting the respective defects. By way of further non-limited example, lack of appropriate FAB data related to a specific layer can be compensated by synthetic images related to this layer. Likewise, lack of data from a specific tool necessary for tool variation training can be compensated by synthetic images related to this tool.

Figure 4:
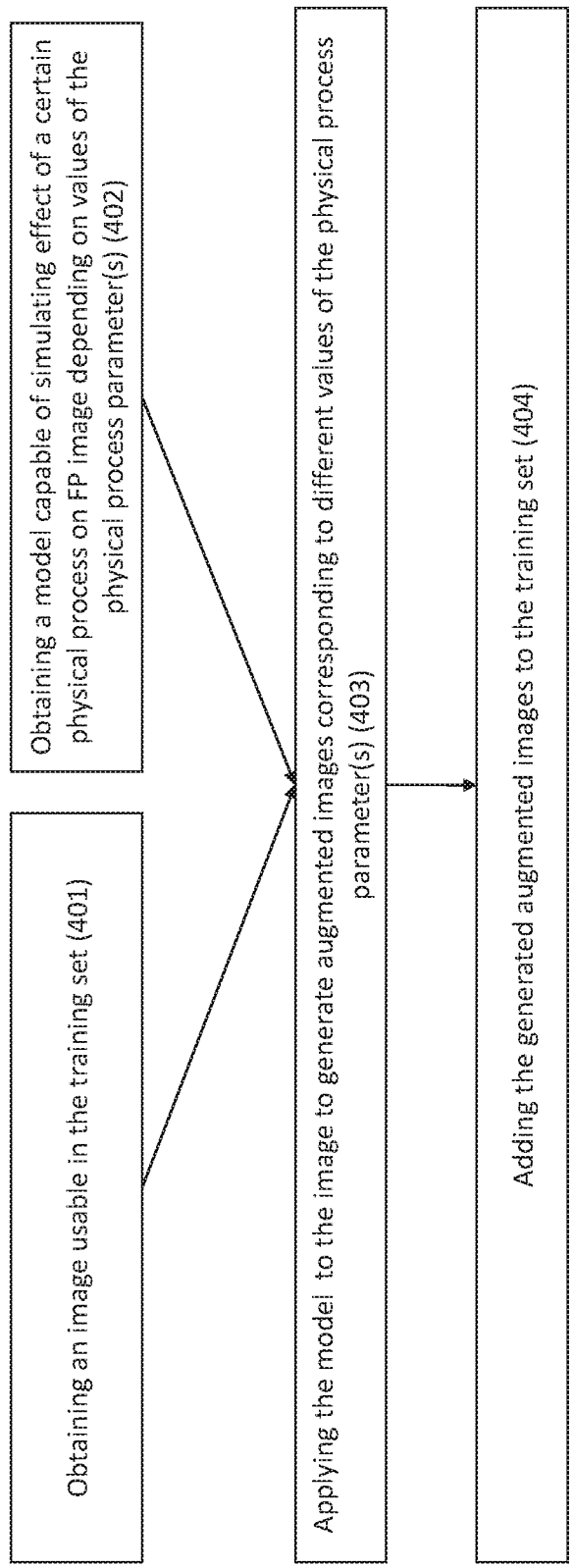
FIG. 4 illustrates a generalized flow-chart of generating a training set with augmented images in accordance with certain embodiments of the presently disclosed subject matter.

Referring to FIG. 4, there is illustrated a generalized flow-chart of generating augmented images for training set.

For purpose of illustration only, the following description is provided for training set usable for training DNN further usable for examination of semiconductor specimen. Those skilled in the art will readily appreciate that the teachings of the presently disclosed subject matter are, likewise, applicable to the training sets usable for automated defect review, automated defect classification, automated navigation during the examination, automated segmentation of FP images, metrology based on FP images and other examination processes that include machine learning. In accordance with certain embodiments of the presently disclosed subject matter, augmentation of images for the training set can enable robustness of the trained DNN to different process variations.

For purpose of illustration only, the following description is provided for augmenting a "real world" image from the training set. Those skilled in the art will readily appreciate that the teachings of the presently disclosed subject matter are, likewise, applicable to synthetic images generated for the training set and/or previously augmented images in the training set.

The process comprises obtaining (402) by the FPEI system a mathematical model (referred to hereinafter also simulation model) capable of simulating effect (typically, unwanted effect although not necessary so) of a certain physical process on FP image depending on the values of the physical process parameter(s). Training set generator applies the simulation model to an image (401) to be augmented for the training set, and thereby generates (403) one or more augmented images corresponding to one or more different values of parameters of a certain physical process. The generated augmented images can be added (404) to the training set. The simulation model can be received by FPEI system 103 from other block(s) (e.g. from storage system 107) of the examination system and/or from an external system(s). Optionally, at least part of the simulation model can be generated by FPEI system 103.

It is noted that the simulation model can be a parametric model or an estimated model of a respective physical effect. It is also noted that an augmented image can be obtained by applying two or more models simulating different physical effects.

Optionally, the generated augmented images in the training set can be weighted, the weights to be considered when applying the training set. By way of non-limiting example, the weighing can be provided between original and augmented images. Alternatively or additionally, the weighing can be provided between augmented images (e.g. depending on likelihood of respective values of the physical process parameters).

Optionally, the generated augmented images can be added to the training set in association with a ground truth data. Original and augmented images can be associated with the same ground truth data (e.g. defect label). Alternatively, augmented images can be associated with augmented ground truth data (e.g. augmented class distribution in the training set).

Optionally, an augmented image can be obtained by applying the simulation model together with other data (e.g. CAD data, reference images, etc.).

Following are non-limiting examples of applying the process above for reducing impact of different interfering effects in accordance with certain embodiments of the presently disclosed subject matter.

Noise:

"Real world" images contain noise where each grey level (GL) intensity contains a different scale of noise intensity. Applying a noise simulation model with desired values of noise parameters to an original image can result in augmented images having different desired levels of added noise. Thus, the training set comprising such augmented images will enable increased robustness of the trained DNN to the noise in FT samples.

GL-Calibration Between Tools:

Grey levels of images taken by the different tools can differ by a factor even when captured at the same location of the same wafer with the same resolution. Thus, training DNN on the images captured by a tool other than a tool that captured FP images can deteriorate generalization capabilities of DNN. In accordance with certain embodiments of the presently disclosed subject matter, each given tool can be associated with GL simulation model tailored to the given tool. Applying such model with desired GL intensity values to the images captured by the given tool results in augmented images for the training set. The training set comprising such augmented images will enable increased robustness to GL tool variations and reduce the necessity of collecting training data from multiple tools.

Focusing Errors:

Some classes of defects (e.g. big pattern damage, big particle, etc.) are more sensitive to focusing errors than other classes. In accordance with certain embodiments of the presently disclosed subject matter, training set generator can apply a defocusing simulation model to the images of defects of defocusing-sensitive classes. The resulted augmented defect with desired values of defocusing can be added to the training set in association with class-indicative labels of respective defects.

Color Variation (CV):

Color variation can occur within a single image (e.g. due to layer thickness variations) or between defect and reference image. CV can stem from different tool calibration and can be characterized by a local change of GL in the image. Applying a CV model to the original image can result in augmented images having different desired levels of added variations. Thus, the training set comprising such augmented images will enable increased robustness to the color variations in FT samples.

Charging:

Charging effects create artificial differences between defect and reference images and can substantially affect the examination processes. Applying a simulation model of charging effects to the original image can result in augmented images enabling the trained DNN to disregard the differences due to charging effect.

Vibrations:

Vibration can cause the spreading of image edges. Applying a model simulating the blurred edges caused by vibration can result in augmented images enabling robustness with regard to the edge smirking effect.

Quad Detectors Mis-Calibration

The calibration of the quad detectors might be suboptimal resulting to images with overlap within different perspectives. Applying a simulation model (optionally, together with CAD data to enhance the edge detection) enables to obtain augmented images having different desired levels of added overlapping. Thus the trained DNN can become more robust with regard to tools calibration.

Among advantages of certain embodiments of the augmentation processes (including the illustrated above) is reducing impact of interfering effects on the trained DNN and, thus, improving robustness and effectiveness of implementing the trained DNN for ADC, ADR, matching, metrology and other examination tasks.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A method of generating a training set for examination of a semiconductor specimen, the method executed by a computer and comprising:
    obtaining a simulation model configured to simulate an effect of a physical process of the imaging semiconductor specimen on real world fabrication process (FP) images, wherein the simulation is based on values of parameters of the physical process, and wherein the effect is an interfering effect that interferes with the examination of the semiconductor specimen;
    applying the simulation model to a real world image to be augmented for the training set to generate one or more augmented images corresponding to one or more different values of the parameters of the physical process;
    including the generated one or more augmented images in the training set; and
    using the training set to train a Deep Neural Network (DNN) for examination of the semiconductor specimen, wherein training the DNN using the training set reduces an impact of the interfering effect on the examination performed by the trained DNN.

2. The method of claim 1, wherein the training set is usable for at least one examination process selected from a group comprising: automated defect review, automated defect classification, automated navigation during the examination, automated segmentation of FP images, and automated metrology based on FP images.

3. The method of claim 1, wherein the FP images are scanning electron microscope (SEM) images.

4. The method of claim 1, wherein the simulation model is a parametric model or an estimated model of a respective simulating effect of the physical process.

5. The method of claim 1, wherein the generated augmented images in the training set are weighted when included in the training set.

6. The method of claim 1, wherein the effect of the physical process is selected from a group comprising noise, Grey Level (GL) calibration between tools, focusing errors, color variation, charging, vibration and quad detectors mis-calibration.

7. The method of claim 1, wherein the generated one or more augmented images are included into the training set in association with a ground truth data.

8. The method of claim 1, wherein the one or more augmented images are generated by applying the simulation model together with design data.

9. A system to examine a semiconductor specimen, the system comprising:
    a processing and memory circuitry (PMC) operatively connected to an input interface, wherein:
        the input interface is configured to receive a real world image to be augmented for a training set; and
        the PMC is configured to:
            obtain a simulation model configured to simulate an effect of a physical process of imaging the semiconductor specimen on real world fabrication process (FP) images, wherein simulation is dependable on values of parameters of the physical process, and wherein the effect is an interfering effect that interferes with the examination of the semiconductor specimen;
            apply the simulation model to the real world image to be augmented for the training set to generate one or more augmented images corresponding to one or more different values of the parameters of the physical process;
            include the generated one or more augmented images into the training set; and
            use the training set to train a Deep Neural Network (DNN) for examination of the semiconductor specimen, wherein training the DNN using the training set reduces an impact of the interfering effect on the examination performed by the trained DNN.

10. The system of claim 9, wherein the training set is usable for at least one examination process selected from a group comprising: automated defect review, automated defect classification, automated navigation during the examination, automated segmentation of FP images, and automated metrology based on FP images.

11. The system of claim 9, wherein the simulation model is a parametric model or an estimated model of a respective the simulating effect of the physical process.

12. The system of claim 9, wherein the PMC is configured to provide weights to the generated augmented images prior to including them in the training set.

13. The system of claim 9, wherein the effect of the physical process is selected from a group comprising noise, Grey Level (GL) calibration between tools, focusing errors, color variation, charging, vibration and quad detectors miscalibration.

14. The system of claim 9, wherein the generated one or more augmented images are included into the training set in association with a ground truth data.

15. The system of claim 9, wherein the PMC is configured to generate the one or more augmented images by applying the simulation model together with other data.

16. A non-transitory computer readable medium comprising instructions that, when executed by a computer, cause the computer to perform operations comprising:
- obtaining a simulation model configured to simulate an effect of a physical process of imaging a semiconductor specimen on real world fabrication process (FP) images, wherein the simulation is dependable on values of parameters of the physical process, and wherein the effect is an interfering effect that interferes with examination of the semiconductor specimen;
- applying the simulation model to a real world image to be augmented for a training set and thereby generating one or more augmented images corresponding to one or more different values of the parameters of the physical process;
- including the generated one or more augmented images in the training set; and
- using the training set to train a Deep Neural Network (DNN) for examination of the semiconductor specimen, wherein training the DNN using the training set reduces an impact of the interfering effect on the examination performed by the trained DNN.

\* \* \* \* \*